(12) United States Patent
Jarvis et al.

(10) Patent No.: US 6,828,891 B2
(45) Date of Patent: Dec. 7, 2004

(54) METHOD FOR ASSEMBLING MAGNETIC MEMBERS FOR MAGNETIC RESONANCE IMAGING MAGNETIC FIELD GENERATOR

(75) Inventors: Peter Jarvis, Florence, SC (US); Ronald Floyd Lochner, Florence, SC (US); Alex Palkovich, Florence, SC (US); Bu-Xin Xu, Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 207 days.

(21) Appl. No.: 10/064,538

(22) Filed: Jul. 25, 2002

(65) Prior Publication Data

US 2004/0016108 A1 Jan. 29, 2004

(51) Int. Cl.[7] ................................. H01F 5/00
(52) U.S. Cl. .................... 335/299; 335/306; 29/599; 29/609
(58) Field of Search ................ 335/216, 296–306; 324/318–322; 29/609, 599

(56) References Cited

U.S. PATENT DOCUMENTS

| | | | |
|---|---|---|---|
| 4,770,723 A | | 9/1988 | Sagawa et al. |
| 4,931,760 A | * | 6/1990 | Yamaguchi et al. ........ 335/306 |
| 5,162,768 A | | 11/1992 | McDougall et al. |
| 5,194,810 A | * | 3/1993 | Breneman et al. .......... 324/319 |
| 5,309,106 A | | 5/1994 | Miyajima et al. |
| 6,336,989 B1 | | 1/2002 | Aoki et al. |
| 6,340,888 B1 | | 1/2002 | Aoki et al. |
| 6,452,472 B1 | * | 9/2002 | Aoki et al. .................. 335/296 |
| 6,650,214 B2 | * | 11/2003 | Aoki et al. .................. 335/299 |
| 2002/0190827 A1 | * | 12/2002 | Aoki et al. .................. 335/299 |
| 2003/0016108 A1 | * | 1/2003 | Aoki et al. .................. 335/297 |

FOREIGN PATENT DOCUMENTS

| | | |
|---|---|---|
| EP | 0 503 881 B1 | 1/1997 |
| EP | 0 998 876 A1 | 4/1999 |
| EP | 0 978 727 A2 | 2/2000 |
| EP | 1 102 077 A2 | 5/2001 |
| EP | 1 207 400 A1 | 5/2002 |
| JP | 03094733 A * | 4/1991 |
| JP | 06224029 A | 8/1994 |
| JP | 2002153438 * | 5/2004 |
| JP | 2001299723 * | 10/2004 |

OTHER PUBLICATIONS

European Search Report, Application No. EP 03 25 4498.
Patent Abstracts of Japan, Publication No. 2001299723, Title: Method for Assembling Magnetic Filed Generator.

* cited by examiner

Primary Examiner—Lincoln Donovan
(74) Attorney, Agent, or Firm—Cantor Colburn LLP

(57) ABSTRACT

Disclosed herein is a magnetic field generator and method for assembling the same for a magnetic resonance imaging system, the method comprising: establishing a layout for a permanent magnet of a magnet assembly comprising a pole piece, a ferromagnetic plate yoke and a permanent magnet. The method also includes populating the layout with a plurality of mock-up sticks and block retainers to form a mock layout for the permanent magnet; and installing a magnet block in place of at least one mock-up stick of the plurality of mock-up sticks. Installing the magnet blocks includes pushing the magnet block along a selected slot formed by the displacement of at least one mock-up stick of the plurality of mock-up sticks.

33 Claims, 5 Drawing Sheets

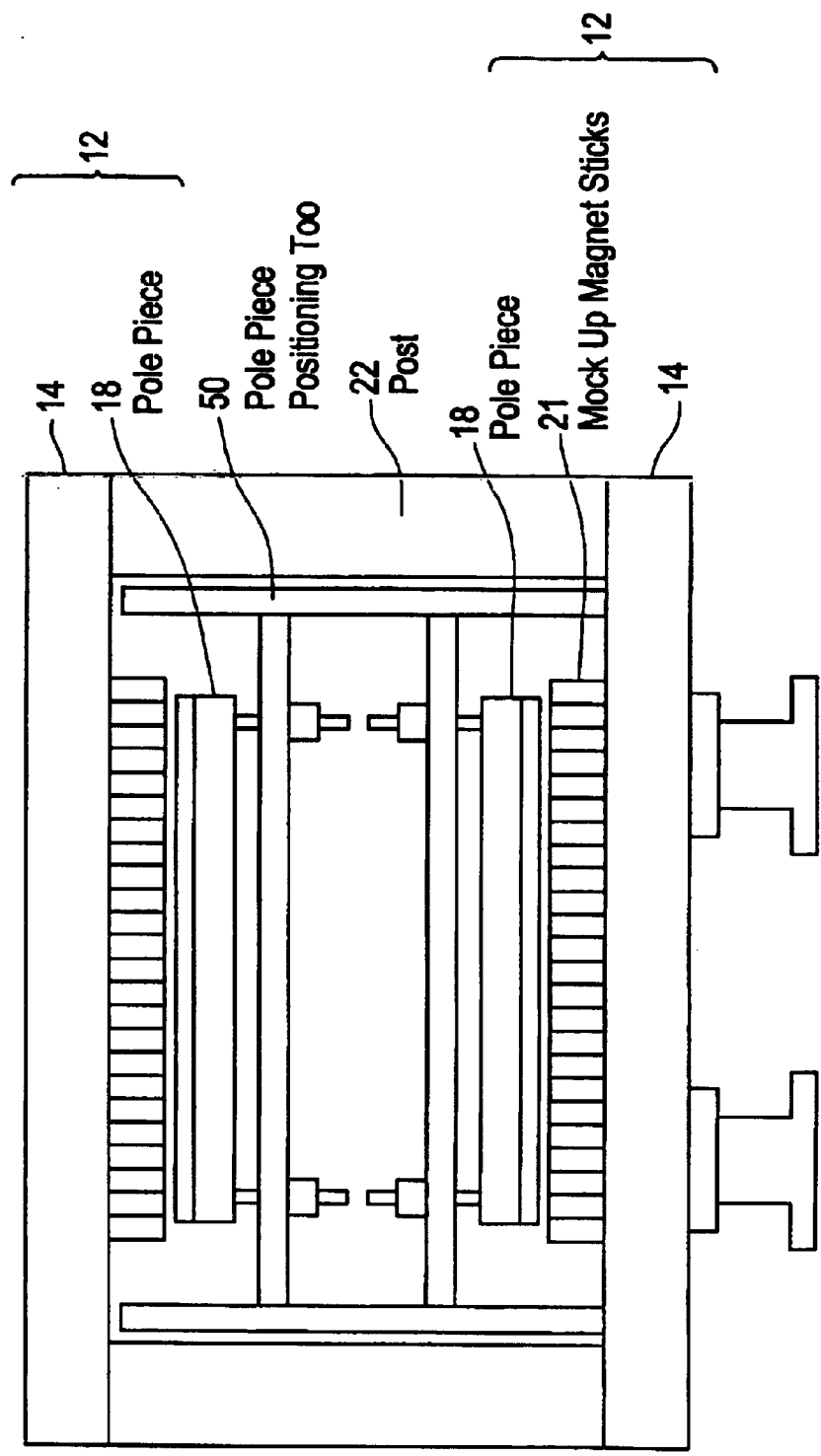

METHOD FOR ASSEMBLING MAGNETIC MEMBERS FOR MAGNETIC RESONANCE IMAGING MAGNETIC FIELD GENERATOR

BACKGROUND OF INVENTION

This invention relates to a magnetic field generator for an MRI, a method for assembling the same, and a method for assembling a magnet unit for the same. More specifically, this invention relates to a magnetic field generator for MRI incorporating permanent magnets, a method for assembling the same, and a method for assembling a magnet unit for the same. It will be appreciated, however, that the-invention is also amenable to other like applications for complex assembly of components exhibiting large interaction forces between the members to be assembled.

A magnetic field generator for MRI uses permanent magnets. The magnets used in such an apparatus are often formulated from a plurality of magnet blocks. It is very difficult to place material blocks first and then magnetize each block. Therefore, in actual manufacturing, the blocks are fabricated and then magnetized. The magnetized blocks are then arranged on a plate yoke so that each of the magnet blocks has a same magnetic pole facing upward. Such arrangement on a plate yoke is difficult due to the interaction of the large magnetic forces between each of the magnet blocks.

Conventionally, when placing the magnet blocks on the plate yoke, a surface of the plate yoke or magnet block is first applied with adhesive, and then magnet blocks are bonded or attached to the surface, as disclosed in the Japanese Patent No. 2,699,250 for example. According to such a bonding method, upper surfaces of respective magnet blocks bonded to the plate yoke surface are not flush with each other, making an uneven surface. A magnetic field generator incorporating the permanent magnets made of such magnet blocks is apt to produce non-uniform magnetic field between a pair of piece poles opposed to each other. Further, pole pieces for correcting the non-uniformity of the magnetic field may be tilted to produce non-uniformity in the magnetic field. Generally, after a step of mounting a pair of permanent magnets to oppose each other, a step of adjustment for uniformly distributing the magnetic field is indispensable. However, if the magnet blocks are mounted according to the above method, the non-uniformity of the magnetic field is so large that the adjustment becomes very time consuming.

Further, according to the above method of bonding the magnet blocks, the magnet blocks each exhibiting very large magnetic forces is placed from above, onto the upper surface of the plate yoke, making extremely difficult to fit each of the magnet blocks snugly to adjacent magnet blocks. More specifically, when mounting, each magnet block is held with a face of predetermined magnetic pole facing upward. When the magnet block is brought above the other magnet block, which is already fixed onto the plate yoke, a pulling force is generated between the two. Further, when the two magnet blocks are brought in adjacency, a repelling force is generated between the two. Since the magnet block to be placed is under such intense forces, the magnet block must be firmly held for safety while being transported. For a conventional holding mechanism, it is very difficult to fit the magnet block snugly to the place of bonding efficiently against these strong forces.

The pair of magnet units thus assembled as above is then opposed to each other so the permanent magnets are faced at one another at a predetermined distance. This is achieved by first assembling one magnet unit, then connecting one or more posts or a column yoke to the magnet unit, and finally connecting the other magnet unit to the post(s).

The post(s) magnetically connect the pair of magnet units, and therefore must be made of a magnetic material. Thus, when the post is connected to the magnet unit, the post is brought under the pulling force from the magnet unit. This large force makes it difficult to connect the two plate yokes with the high accuracy. Likewise, when the second magnetic unit is connected to the post already connected to the first magnet unit, it is also difficult to connect the two at a high accuracy.

Another method to assemble a magnetic field generator is disclosed by EP0978727A2. In this patent, a non-magnetic fixed projection is place at the center of the yoke, with two orthogonal guide rails. The magnetic blocks are then slid into place and bonded to each other along the non-magnetic fixed projection and guide rails. This approach while adequate for its intended purposes is still cumbersome and requires additional special tooling. What is desired is a method for assembling the magnetic field generator to desired tolerances with a minimum of specialized tooling and assembly steps.

SUMMARY OF INVENTION

The above discussed and other drawbacks and deficiencies are overcome or alleviated by a magnetic field generator and method for assembling the same, for a magnetic resonance imaging system, the method comprising: establishing a layout for a permanent magnet of a magnet assembly comprising a pole piece, a ferromagnetic plate yoke and a permanent magnet. The method also includes populating the layout with a plurality of mock-up sticks and block retainers to form a mock layout for the permanent magnet; and installing a magnet block in place of at least one mock-up stick of the plurality of mock-up sticks. Installing the magnet blocks includes pushing the magnet block along a selected slot formed by the displacement of at least one mock-up stick of the plurality of mock-up sticks.

The method of may also include repeating the abovementioned installing until each mock-up stick of the plurality of mock-up sticks is replaced by a plurality of magnet blocks. Additionally, the method may also include installing a pole piece positioning tool to facilitate location and placement of the pole piece on said magnet assembly.

Also disclosed herein is a magnetic field generator for a magnetic resonance imaging system. The magnet field generator comprises a layout for a permanent magnet of a magnet assembly comprising a pole piece, a ferromagnetic plate yoke and a permanent magnet. The magnet field generator also comprises a plurality of mock-up sticks and block retainers populating the layout to form a mock layout for the permanent magnet; and a magnet block installed in place of at least one mock-up stick of the plurality of mock-up sticks. The installation of the magnet block comprises pushing the magnet block along a selected slot formed by the displacement of the at least one mock-up stick of the plurality of mock-up sticks.

The above discussed and other features and advantages of the present invention will be appreciated and understood by those skilled in the art from the following detailed description and drawings.

BRIEF DESCRIPTION OF DRAWINGS

Referring to the exemplary drawings wherein like elements are numbered alike in the several Figures:

FIG. 3 depicts an exemplary a pole piece positioning apparatus;

DETAILED DESCRIPTION

Disclosed herein is another method and system for assembly of a permanent magnet such as employed in a magnetic field generator for MRI. The method and system employs a series of gliders and rails to guide a plurality of magnet blocks into a desired position on a yoke plate. It should be noted that although the disclosed embodiments are described by way of reference to assembly of a magnetic field generator for MRI applications, it will be appreciated that such references are illustrative only and the disclosed embodiments may be applied to any instance of assembly where there are large interaction forces between the elements to be assembled. Moreover, the references and descriptions herein may apply to many forms of assembly beyond magnets and magnetic blocks.

Figure 1:
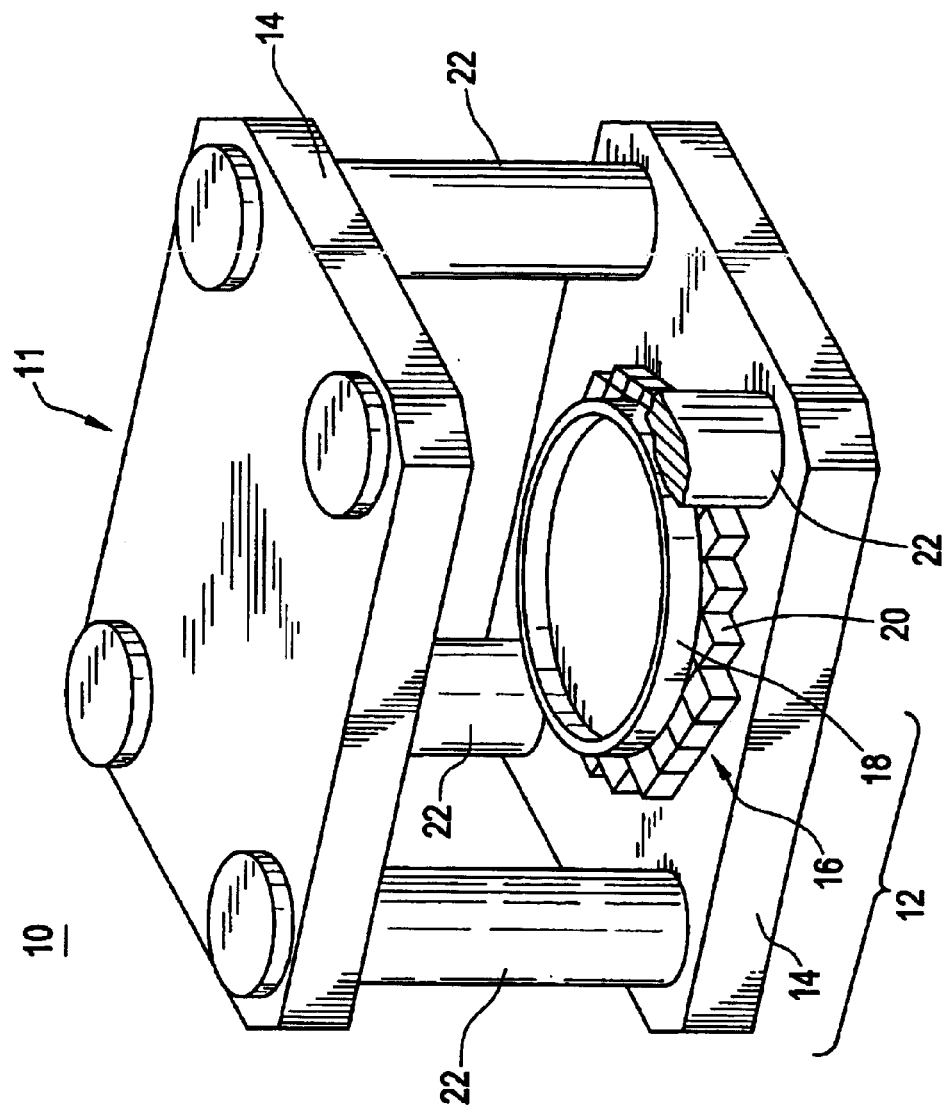
FIG. 1 depicts an cutaway view of an exemplary MRI magnetic field generator assembly.

Referring first to FIG. 1, a magnetic field generator for MRI 10 as an embodiment of this invention comprises an upper magnet unit 11 and lower magnet unit 12. Each of the magnet units 11 and 12, includes, but is not limited to, a plate yoke 14. Each of the plate yokes 14 has a surface opposed to the other plate yoke, and this surface is provided with a permanent magnet 16, on which a pole piece 18 is provided. Each of the permanent magnets 16 includes a plurality of magnet blocks 20. Each of the magnet blocks 20 of the magnet unit 12 is fitted with adjacent ones, with a same magnetic pole facing the upward. On the other hand, each of the magnet blocks 20 of the magnet unit 11 is fitted with adjacent ones, with the other magnetic pole facing downward. In other words, the permanent magnet 16 of the magnet unit 12 and the permanent magnet 16 of the magnet unit 11 are faced to each other so that different magnetic poles are opposed to each other.

The magnet blocks 20 may be a magnet made from a ternary system compound Nd—Fe—B composed mainly of neodynium (Nd), iron (Fe) and boron (B). Alternatively, part of Nd of the Nd—Fe—B may be replaced by dysprosium (Dy) while part of the Fe may be replaced by cobalt (Co). The Nd—Fe—B is known as a strong neodynium magnetic material with a maximum energy product of over 320 kj/m 3. It should be noted here that a method for making a rare earth magnet is disclosed in detail, for example, in the U.S. Pat. No. 4,770,723.

The pair of opposed magnet units 11 and 12, are supported and magnetically connected by one or more posts 22, with a selected space in between, for example 40 cm to 60 cm. With such a structure, the magnetic field generator 10 is configured to form a uniform magnetic field in a space between the pair of pole pieces 18.

Now, for the above magnetic field generator 10, description will be made as to a method for assembling the permanent magnet 16 by placing a plurality of magnet blocks 20 in a generally disc pattern on an upper surface of the plate yoke 14. Each of the magnet blocks 20 used in this embodiment includes a plurality (eight, for example) of magnet members. The magnet member is made by pressing and sintering magnetic powder into a general cube having the side of 4 cm to 15 cm. Then the plurality of magnet members are bonded with each other and magnetized.

Figure 2:
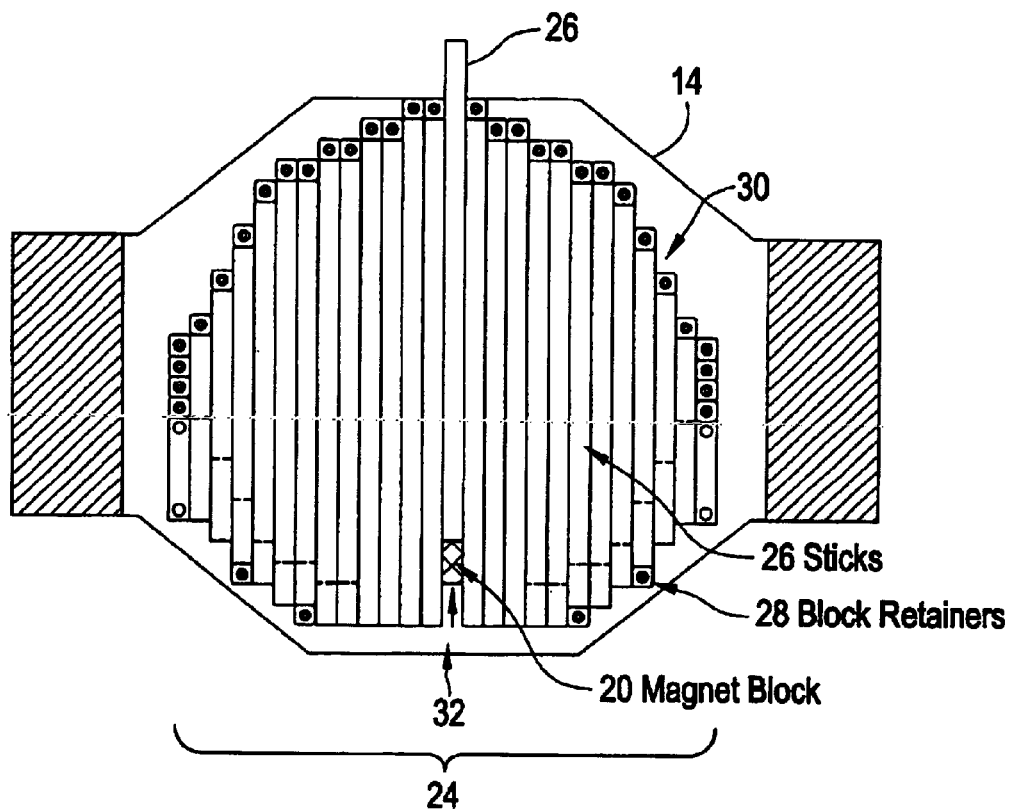
FIG. 2 depicts a graphical representation of a mock layout with exemplary mockup sticks and insertion of a magnet block.

Referring to FIG. 2, a plurality of mock-up sticks 24 are fabricated to selected lengths with non-magnetic materials such as aluminum, stainless steel and plastics. The size of each mock-up stick 26 of the plurality of mock-up sticks 24 is essentially the same as the real magnet blocks 20 but with slightly larger width, for example, about 0.2 mm larger and of a selected length. Each mock-up stick may comprise one or more mock-up blocks 25. To facilitate the assembly process for the permanent magnet 16, the assembly is initially "fabricated" employing the set mock-up sticks 24 laid out in parallel to populate the area for the permanent magnet 16. In an exemplary embodiment, each of the mock-up sticks 26 is configured to be essentially the same cross section as a magnet block 20 with a length preferably approximately as long as a particular selected column of magnet blocks 20 on the yoke plate 14. Once again, it should be appreciated a mock-up stick 26 may comprise a plurality of mock-up blocks 25 laid out end to end to formulate a "stick". Employing the plurality of mockup sticks 24, laid out in a parallel, side-by-side, sequential fashion to form a complete mock layout 30 of the permanent magnet 16 may be created as depicted in FIG. 2. In an exemplary embodiment, it will be appreciated that each mock-up stick is configured to be of maximum length and therefore, the complete mock layout 30 comprises a single row of mock-up sticks 26 laid out side by side. FIG. 2 depicts such an exemplary configuration for the mock layout 30.

The mock layout 30 is configured on the yoke plate 14 such that with the plurality of mock-up sticks 24 and plurality of block retainers 28 in place, a (which may include more than one) mock-up stick 26 may be removed or displaced leaving behind a slot 32 comprised on the sides of the two adjacent mock-up sticks 26 and on the bottom (or top) by the plate yoke 14. The block retainer 28 may include, but not be limited to, a block or clamp apparatus. The plurality of block retainers 28 are arranged over the perimeter of the magnet unit (11 or 12) and detachably fixed to the yoke plate 14 in a manner that facilitates assembly such as with a fastener, keeper, or adhesive. The end of the slot 32 may be constrained by a block retainer 28 or the block retainer may be removed to facilitate assembly. The remaining slot 32 may now act as a set of guides, into which, a series of magnet blocks 20 may be sequentially slid with relative ease and accuracy. Advantageously, because the mock-up sticks 26 are made of non-magnetic materials, there is no magnetic interaction forces among the mock-up sticks 26 and the yoke plate 14, the pole piece 18, or other elements of the magnetic field generator 10 involved in this process. The assembly process is therefore relatively easy and conventional. The magnet blocks 20 and other components can be located as accurately as needed to maintain the desired assembly tolerances for the magnet units 11 and 12. Therefore, with removal/displacement of a first mock-up stick 26, subsequent magnet blocks 20 may be inserted specifically denoted in FIG. 3 and discussed further herein.

Turning now to FIG. 3, a pole piece positioning apparatus 50 is mounted between magnet pole pieces 18 of upper magnet unit 11 and lower magnet unit 12. The function of this apparatus is to keep pole piece 18 in accurate radial position but to allow establishing a small axial gap between pole piece 18 and mock-up sticks 26 and/or magnet blocks 20 and thereby allowing the magnet assembly process to continue without interference from the pole piece 18. The pole piece positioning apparatus 50 also eliminates possible movement of pole piece 18 due to magnetic forces during magnet block 20 insertions.

Figure 4:
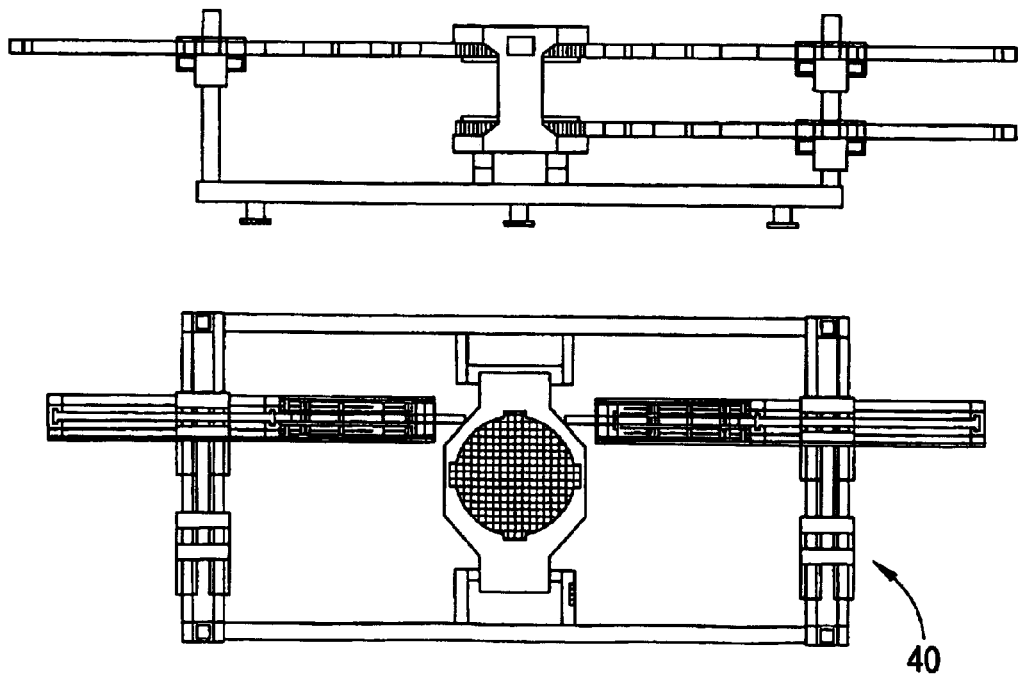
FIG. 4 depicts two views of an exemplary magnet block push tool configured with a field generator assembly.

Turning now to FIG. 4, a exemplary apparatus for insertion of the magnet blocks 20 is depicted. Shown in the figure is a magnet block pusher 60 configured so that it may be aligned with each of the magnet units 11 and 12 in a manner that facilitates sliding individual magnet blocks 20 into the mock layout 30. In an exemplary embodiment, the block retainers 28 are removed from the yoke plate 14 and the magnet blocks 20 are magnetized and then placed on a magnet block pusher 60 for insertion. It will be appreciated that the magnet block 20 is configured to be approximately 0.2 mm smaller width than mock-up stick 26, and therefore the magnet block 20 may be readily pushed into the mock layout 30 displacing a mock-up stick 26 and following the trajectory of mock-up stick 26 into the magnet unit 11, 12.

After a first magnet block 20 is pushed into mock layout 30, a second magnetized magnet block 20 is put on magnet block pusher 60 and pushed into mock layout 30 next to first magnet block 20. In an exemplary embodiment, the size and geometry of magnet blocks 20 are configured so that the friction force between iron plate yoke 14 and other permanent magnet blocks 20 is larger than the magnetic repelling force of two magnet blocks 20 positioned next each other. Therefore, it is not necessary to apply adhesive between two magnet blocks 20 to secure them. Other embodiments may be employed perhaps utilizing larger tolerances in the assembly and employing adhesives or epoxies as required to retain the assembly.

This feature of an exemplary embodiment eliminating the need for adhesives provides significant advantages in that it facilitates rework of the magnet assembly should it be necessitated. For example, should a damaged magnet block 20 require removal, because no adhesives are employed between the magnet block or the magnet blocks and the yoke plate 14, the assembly process may be essentially reversed. The damaged magnet block removed, and replaced with a new one.

Figure 5:
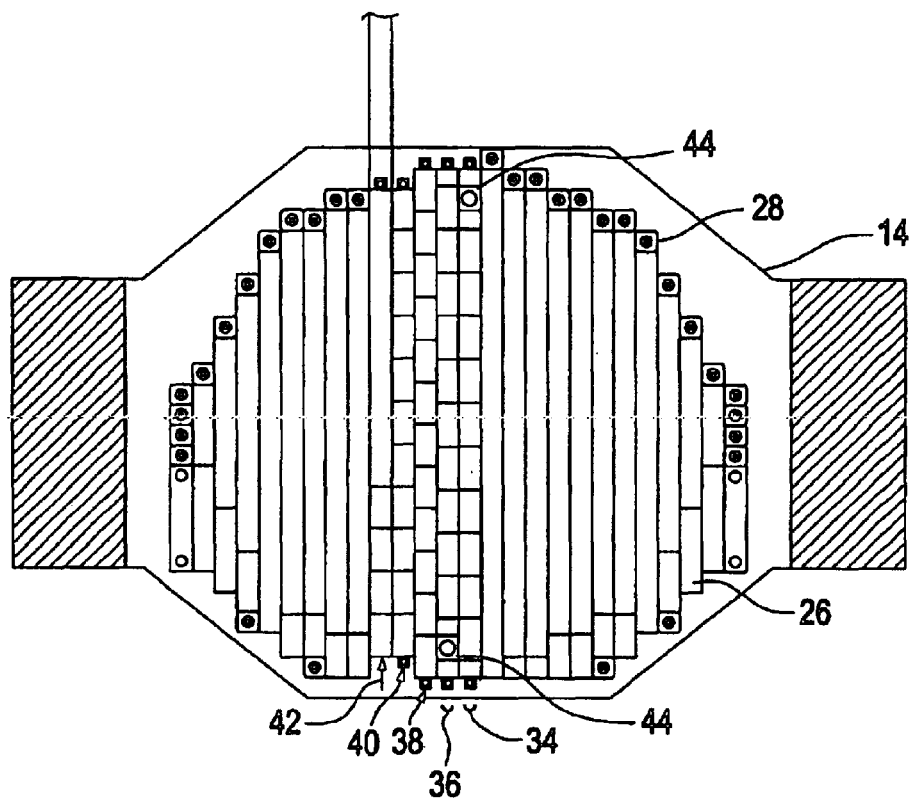
FIG. 5 is a graphical representation depicting further magnet block insertion on a yoke plate in an exemplary embodiment.
Figure 6:
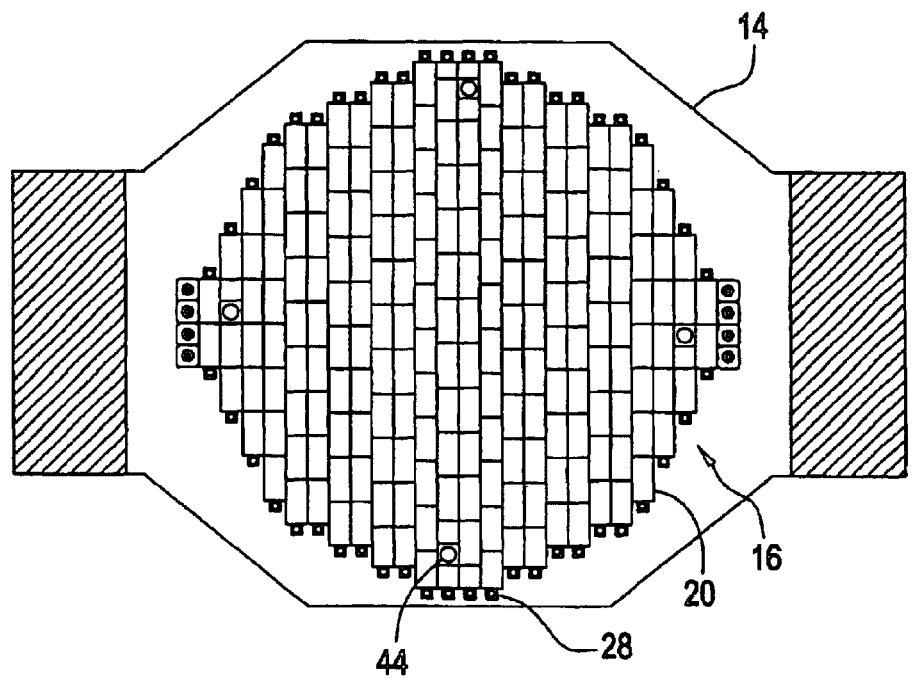
FIG. 6 is a graphical representation of an exemplary process depicting a complete layout and assembly of all the permanent magnet blocks.

By repeating the above process, a whole column of one or more of the non-magnetic mock-up blocks 24 are replaced by column denoted by 34 of real permanent magnet blocks 20 as depicted in FIG. 5. After this operation is completed, the block retainers are reinstalled to secure the positions of this particular column 34 of permanent magnet blocks 20. Turning now to another column once again, comprising one or more mock-up sticks, another magnetized magnet block 20 is put on magnet block pusher 60 and pushed into mock layout 30, this time in another slot formed by the removal or displacement of a mock-up stick 26. Once again, by repeating the above process, a whole column comprising at least one non-magnetic mock-up stick 26 is replaced by second column denoted in this instance by 36 of real magnet blocks 20. It will be appreciated, that in an exemplary embodiment, the first column 34 and second column 36 are adjacent to one another such that the slot formed by the removal/displacement of the mock-up stick 26 is comprised, in this second instance, on one side by another column of at least one mock-up stick 26, on the other side by the first column 34 of magnet blocks 20 and on the bottom (or top) by the plate yoke 14. With the same process, each of subsequent mock-up sticks 26 are replaced, forming subsequent third, fourth, and fifth columns e.g., 38, 40, and 42 respectively, of permanent magnet blocks 20. FIG. 5 depicts a partially complete assembly of permanent magnets 20. Finally, with the same process, each of subsequent columns of at least one mock-up stick 26 are replaced, forming the complete layout of the permanent magnet 16. FIG. 6 depicts the complete layout and assembly of all the permanent magnet blocks 20.

It will be appreciated, that it may be necessary to leave some locations in the magnet 16 unoccupied by magnet blocks 20 to provide a means for securing the pole piece 18. In an exemplary embodiment, a magnetic or non-magnetic spacer/insert 44 is inserted at selected intervals with the magnet blocks 20 to ensure access for a fastener. As is evident from observation of FIG. 5, certain column e.g., 34, 36 may require insertion of inserts 44, as well as combinations of various sizes of magnetic blocks to achieve the desired layout. Looking to columns 34, and 36 for example, 3 magnet blocks 20 of approximately one half the length of most other magnet blocks are employed at selected intervals to facilitate the depicted layout.

Figure 7:
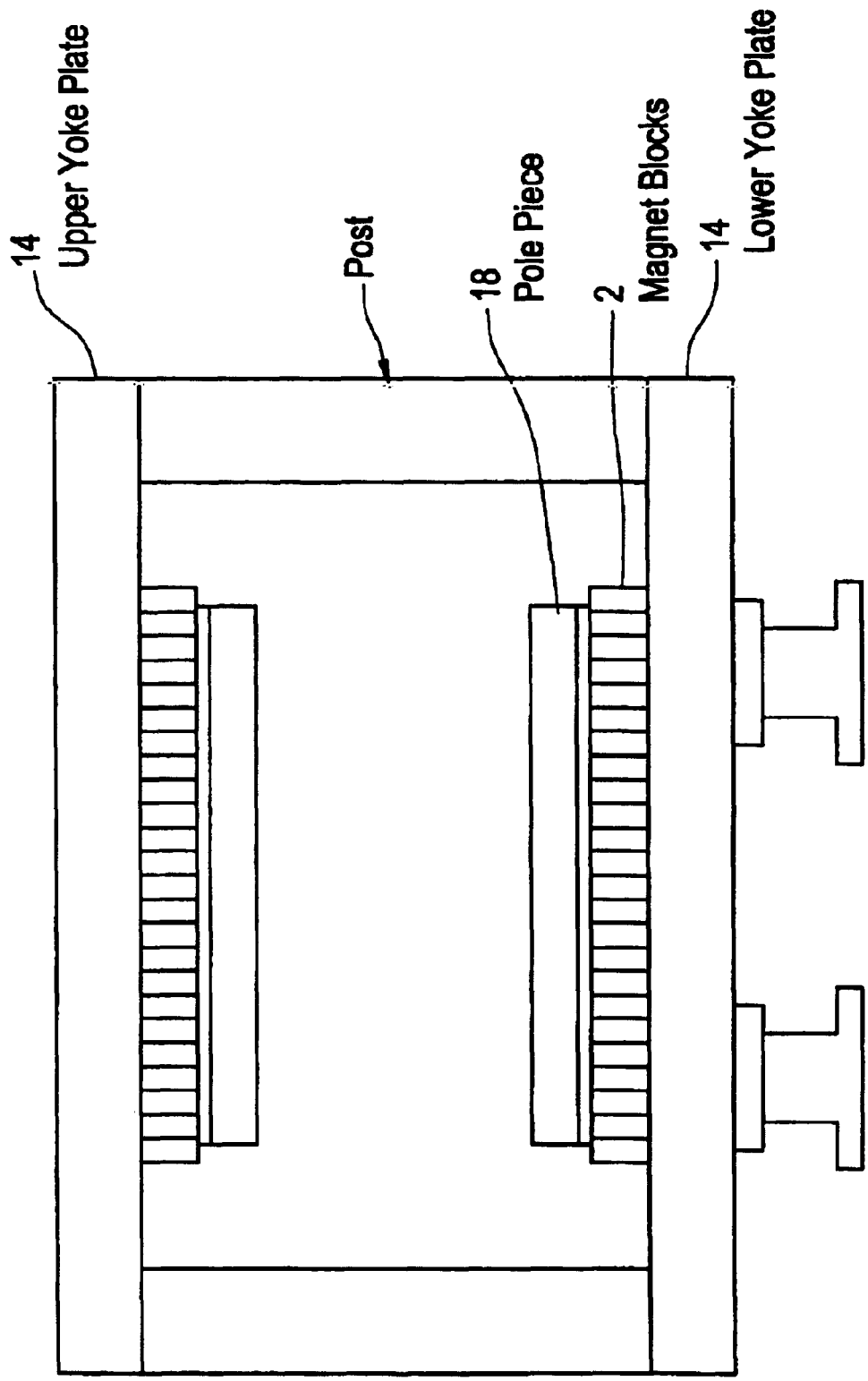
FIG. 7 depicts a completed magnet assembly.

Finally, to complete the magnet assembly, after all mock-up sticks 26 are replaced by magnet blocks 20 the permanent magnet 16 is complete. The top and bottom pole pieces 18 may be engaged to the original position from pole piece positioning tool mating with the permanent magnets 16 and the task of permanent magnet assembly is completed. FIG. 7 depicts the completed assembly.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for assembling a magnetic field generator for a magnetic resonance imaging system, the method comprising:

establishing a layout for a permanent magnet of a magnet assembly comprising a pole piece, a ferromagnetic plate yoke and a permanent magnet;

populating said layout with a plurality of mock-up sticks and block retainers to form a mock layout for said permanent magnet; and installing a magnet block in place of at least one mock-up stick of said plurality of mock-up sticks, wherein said installing comprises pushing said magnet block along a selected slot formed by the displacement of said at least one mock-up stick of said plurality of mock-up sticks.

2. The method of claim 1 further including repeating said installing until each said at least one mock-up stick of said plurality of mock-up sticks is replaced by a plurality of magnet blocks.

3. The method of claim 1 further including installing a pole piece positioning tool to facilitate location and placement of said pole piece on said magnet assembly.

4. The method of claim 1 wherein said layout comprises a desired configuration of said permanent magnet divided into segments about equal to the width of a magnet block with selected respective lengths.

5. The method of claim 1 wherein said mock-up sticks exhibit a width just larger than the width of said magnet block.

6. The method of claim 1 wherein each mock-up stick of said plurality of mock-up sticks respectively, exhibits a length substantially equal to said selected respective lengths.

7. The method of claim 1 wherein each mock-up stick of said plurality of mock-up sticks is non-magnetic.

8. The method of claim 1 wherein said populating includes arranging said plurality of mock-up sticks in a parallel, side-by-side, sequential manner.

9. The method of claim 1 said installing includes a magnet block pusher tool configured to facilitate said pushing said magnet block along a selected slot formed by the displacement of said at least one mock-up stick of said plurality of mock-up sticks.

10. The method of claim 1 said installing includes securing said magnet block employing at least one of; frictional engagement between said magnet block and at least one of another magnet block and said block retainer, and an adhesive.

11. A method for assembling a magnetic field generator for a magnetic resonance imaging system, the method comprising:
establishing a layout for a permanent magnet of a magnet assembly comprising a pole piece, a ferromagnetic plate yoke and a permanent magnet;
populating said layout with a plurality of mock-up sticks and block retainers to form a mock layout for said permanent magnet;
installing a magnet block in place of at least one mock-up stick of said plurality of mock-up sticks, wherein said installing comprises pushing said magnet block along a selected slot formed by the displacement of said at least one mock-up stick of said plurality of mock-up sticks; and
wherein said magnet block is frictionally secured within said layout.

12. A magnetic field generator for a magnetic resonance imaging system comprising:
a layout for a permanent magnet of a magnet assembly comprising a pole piece, a ferromagnetic plate yoke and a permanent magnet;
a plurality of mock-up sticks and block retainers populating said layout to form a mock layout for said permanent magnet; and
a magnet block installed in place of at least one mock-up stick of said plurality of mock-up sticks, wherein installing said magnet block comprises pushing said magnet block along a selected slot formed by the displacement of said at least one mock-up stick of said plurality of mock-up sticks.

13. The magnetic field generator of claim 12 further including repeating said installing until each said at least one mock-up stick of said plurality of mock-up sticks is replaced by a plurality of magnet blocks.

14. The magnetic field generator of claim 12 further including installing a pole piece positioning tool to facilitate location and placement of said pole piece on said magnet assembly.

15. The magnetic field generator of claim 12 wherein said layout comprises a desired configuration of said permanent magnet divided into segments about equal to the width of a magnet block with selected respective lengths.

16. The magnetic field generator of claim 12 wherein said mock-up sticks exhibit a width just larger than the width of said magnet block.

17. The magnetic field generator of claim 12 wherein each mock-up stick of said plurality of mock-up sticks respectively, exhibits a length substantially equal to said selected respective lengths.

18. The magnetic field generator of claim 12 wherein each mock-up stick of said plurality of mock-up sticks is non-magnetic.

19. The magnetic field generator of claim 12 wherein said populating includes arranging said plurality of mock-up sticks in a parallel, side-by-side, sequential manner.

20. The magnetic field generator of claim 12 said installing includes a magnet block pusher tool configured to facilitate said pushing said magnet block along a selected slot formed by the displacement of said at least one mock-up stick of said plurality of mock-up sticks.

21. The method of claim 12 said installing includes securing said magnet block employing at least one of; frictional engagement between said magnet block and at least one of another magnet block and said block retainer, and an adhesive.

22. A magnetic field generator for a magnetic resonance imaging system comprising:
a layout for a permanent magnet of a magnet assembly comprising a pole piece, a ferromagnetic plate yoke and a permanent magnet;
a plurality of mock-up sticks and block retainers populating said layout to form a mock layout for said permanent magnet;
a magnet block installed in place of at least one mock-up stick of said plurality of mock-up sticks, wherein installing said magnet block comprises pushing said magnet block along a selected slot formed by the displacement of said at least one mock-up stick of said plurality of mock-up sticks; and
wherein said magnet block is frictionally secured within said layout.

23. A magnetic field generator for a magnetic resonance imaging system comprising:
means for establishing a layout for a permanent magnet of a magnet assembly comprising a pole piece, a ferromagnetic plate yoke and a permanent magnet;
means for populating said layout with a plurality of mock-up sticks and block retainers to form a mock layout for said permanent magnet; and
means for installing a magnet block in place of at least one mock-up stick of said plurality of mock-up sticks, wherein said installing comprises pushing said magnet block along a selected slot formed by the displacement of said at least one mock-up stick of said plurality of mock-up sticks.

24. The magnetic field generator of claim 23 further including means for repeating said installing until each said at least one mock-up stick of said plurality of mock-up sticks is replaced by a plurality of magnet blocks.

25. The magnetic field generator of claim 23 further including a means for installing a pole piece positioning tool to facilitate location and placement of said pole piece on said magnet assembly.

26. The magnetic field generator of claim 23 wherein said layout comprises a desired configuration of said permanent magnet divided into segments about equal to the width of a magnet block with selected respective lengths.

27. The magnetic field generator of claim 23 wherein said mock-up sticks exhibit a width just larger than the width of said magnet block.

28. The magnetic field generator of claim 23 wherein each mock-up stick of said plurality of mock-up sticks respectively, exhibits a length substantially equal to said selected respective lengths.

29. The magnetic field generator of claim 23 wherein each mock-up stick of said plurality of mock-up sticks is non-magnetic.

30. The magnetic field generator of claim 23 wherein said populating includes arranging said plurality of mock-up sticks in a parallel, side-by-side, sequential manner.

31. The magnetic field generator of claim 23 said installing includes a magnet block pusher tool configured to facilitate said pushing said magnet block along a selected slot formed by the displacement of said at least one mock-up stick of said plurality of mock-up sticks.

32. The magnetic field generator of claim 23 said means for installing includes a means for securing said magnet block employing at least one of; frictional engagement between said magnet block and at least one of another magnet block and said block retainer, and an adhesive.

33. A magnetic field generator for a magnetic resonance imaging system comprising:

means for establishing a layout for a permanent magnet of a magnet assembly comprising a pole piece, a ferromagnetic plate yoke and a permanent magnet;

means for populating said layout with a plurality of mock-up sticks and block retainers to form a mock layout for said permanent magnet;

means for installing a magnet block in place of at least one mock-up stick of said plurality of mock-up sticks, wherein said installing comprises pushing said magnet block along a selected slot formed by the displacement of said at least one mock-up stick of said plurality of mock-up sticks; and wherein said magnet block is frictionally secured within said layout.

* * * * *

UNITED STATES PATENT AND TRADEMARK OFFICE
CERTIFICATE OF CORRECTION

| | |
|---|---|
| PATENT NO. | : 6,828,891 B2 |
| APPLICATION NO. | : 10/064538 |
| DATED | : December 7, 2004 |
| INVENTOR(S) | : Peter Jarvis et al. |

It is certified that error appears in the above-identified patent and that said Letters Patent is hereby corrected as shown below:

<u>Column 6,</u>
Line 26, after "tool", insert therefor --50,--.

Signed and Sealed this

Eighth Day of August, 2006

JON W. DUDAS
*Director of the United States Patent and Trademark Office*